(12) United States Patent
Akyildiz et al.

(10) Patent No.: US 8,111,535 B2
(45) Date of Patent: Feb. 7, 2012

(54) PRESETABLE RAM

(75) Inventors: Ahmet Akyildiz, Saratoga, CA (US);
Gregory Jon Richmond, Cupertino, CA (US)

(73) Assignee: Silicon Labs Spectra, Inc., Sunnyvale, CA (US)

( * ) Notice: Subject to any disclaimer, the term of this patent is extended or adjusted under 35 U.S.C. 154(b) by 358 days.

(21) Appl. No.: 12/369,875

(22) Filed: Feb. 12, 2009

(65) Prior Publication Data
US 2009/0201712 A1 Aug. 13, 2009

Related U.S. Application Data

(60) Provisional application No. 61/027,970, filed on Feb. 12, 2008.

(51) Int. Cl.
*G11C 5/06* (2006.01)
(52) U.S. Cl. .................. 365/63; 365/189.05; 365/189.08
(58) Field of Classification Search .................... 365/63, 365/189.01, 148, 205, 189.05, 189.08, 201, 365/194, 149, 203, 94, 230.06, 189.15
See application file for complete search history.

(56) References Cited

U.S. PATENT DOCUMENTS

| 2002/0186589 A1* | 12/2002 | Makuta et al. | 365/185.09 |
| 2008/0074936 A1* | 3/2008 | Kim et al. | 365/189.15 |
| 2008/0080284 A1* | 4/2008 | Mayer et al. | 365/222 |

OTHER PUBLICATIONS

Declaration of Greg Richmond, Vice President of Engineering and Chief Technical Officer of SpectraLinear, Inc., under 37 CFR 1.56.

* cited by examiner

*Primary Examiner* — Dang Nguyen
(74) *Attorney, Agent, or Firm* — Zagorin O'Brien Graham LLP

(57) ABSTRACT

A programmable volatile memory cell has a reset device in communication with a bit store. The reset device may produce a high or low logic state within a latch loop when activated by an assertive logic level on a reset line. A set of mask programmable vias may be provided on a single mask layer in a semiconductor fabrication process for the memory cell. A program-selectable one of two sets of vias may communicate with one reset device to the reset line and the other reset device to ground. In this way a single and programmatically determinable logic state may be produced in the memory cell with reset signaling. Otherwise, the memory cell is capable of retaining a logic state according to read/write processes. The memory cell may be implemented in an array where all or some of the cells may be reset at once.

13 Claims, 9 Drawing Sheets

PRESETABLE RAM

CROSS-REFERENCES TO RELATED APPLICATIONS

This application claims priority from U.S. Provisional Patent Application No. 61/027,970, filed Feb. 12, 2008, entitled "PRESETABLE RAM," which is hereby incorporated by reference, as if set forth in full in this document, for all purposes.

BACKGROUND

Embodiments of present invention relate to memory in general and, in particular, to presetable random access memory.

In electrical circuits, it is common to store data or operating instructions in some type of memory element. In cases where it is desired to allow the user to change this data during circuit operation, the information is typically stored in a Random Access Memory (RAM). A RAM cell, upon reset or startup does not have a predefined usable value. However, particular values may be desired in the RAM upon the RAM receiving a reset signal or a startup signal. Traditionally, designers have sought different approaches to have a RAM cell initialize with a default logic value programmed into the cell, either right after start up or at a selectable point during operation of the circuit, while still offering generic read/write RAM characteristics.

One method to loading RAM with a particular set of values upon power-up or reset is through the use of a ROM (Read Only Memory). While ROMs have been used to load RAM upon reset or startup, relying solely on ROMs may have certain inherent problems. Using ROM takes up physical space on the circuit board it is installed on. Additional circuitry translates to increased cost, power consumption, heat dissipation, and the requirement for the signals from the ROM to be routed to the RAM that is to be programmed using either wires, traces, or vias. Further, a time delay exists between the issuing of the reset/power-up signal to the RAM and ROM, and when the desired values are available to be read from the RAM. This delay is due to the fact the ROM must transfer all desired values to the RAM upon receiving the reset/power-up signal. Relying solely on ROM may result in a significant time delay before the desired values are accessible in the RAM, and may result in less than optimal performance in the implementation of some circuits.

An external ROM is not the only means of setting the values of a RAM. Methods that function internal to RAM cells also exist. An array of SRAM (Static Random Access Memory) cells may be used to store logic values. An array of SRAM cells is made of typically a large number of individual SRAM cells. Upon power-up or reset, the cells of an SRAM array do not have predefined values. FIG. 1 depicts a single SRAM cell. In FIG. 1, a first inverter 105$a$ and a second inverter 105$b$ are cross-connected to form a Latch Loop 110 in a SRAM cell resetting configuration 100. The first inverter 105$a$ and the second inverter 105$b$ each are electrically connected to $V_{DD}$ (VP) and Ground (VG). A Bitline (B) 115$a$ and a Bitline_Bar (BN) 115$b$ electrically connect to a first Latch Loop output (B_INT) 120$a$ and a second Latch Loop output (BN_INT) 120$b$ through a first Bitline Accessing device (MN3) 125$a$ and a second Bitline Accessing device (MN4) 125$b$ respectively. A Wordline (W) 130 is electrically attached to control inputs of the first Bitline Accessing device 125$a$ and the second Bitline Accessing device 125$b$ respectively. Resetting of the SRAM cell occurs by producing a low logic level (Load "0") and a high logic level (Load "1") being applied on the Bitline 115$a$ and the Bitline_Bar 115$b$ respectively while a high logic level is applied to the Word line 130. Generally, complementary logic levels applied to the Bitline 115$a$ and the Bitline_Bar 115$b$, along with application of the assertive logic level (high logic level) on the Word line 130, produce a corresponding logic state in the Latch Loop 110. A method such as this is a problem because it is time-consuming: each cell must be accessed individually using the Bitline, and the wordline.

SRAM is also available in a configuration which has a reset component present within each cell. This embodiment is depicted in FIG. 2. Referring now to FIG. 2, a first inverter 205$a$ and a second inverter 205$b$ are cross-connected to form a Latch Loop 210 in a SRAM cell resetting configuration 200. The first inverter 205$a$ and the second inverter 205$b$ each are electrically connected to $V_{DD}$ (VP) and Ground (VG). A Bitline (B) 215$a$ and a Bitline_Bar (BN) 215$b$ are electrically connected to a first Latch Loop output (B_INT) 220$a$ and a second Latch Loop output (BN_INT) 220$b$ through a first Bitline Accessing device (MN3) 225$a$ and a second Bitline Accessing device (MN4) 225$b$ respectively. A Wordline (W) 230 connects to control inputs of the first Bitline Accessing device 225$a$ and the second Bitline Accessing device 225$b$ respectively. A reset device 235 is connected between an input to the second inverter 205$b$ and Ground. A Reset line (RST) 240 connects to a control input of the Reset device 235. Resetting of the SRAM cell occurs by producing a high logic level on the Reset line 240, which activates the Reset device 235. The active Reset device 235 places a low logic level into the second inverter 205$b$. The low logic level provided to the input of the second inverter 205$b$ produces reset state for Latch Loop 210. Generally, a reset device may be configured to produce a predetermined logic state in a RAM cell latch loop with corresponding activation. A problem with this method of using a reset device is that each reset device in each SRAM cell is configured identically. Therefore, each reset device sets the same value as each other reset device in other SRAM cells, meaning that upon a reset or power-up signal every cell within the SRAM array is set to the same logical value.

Since different applications may require different default contents of RAM, it is desirable to allow these default contents to be changed inexpensively. However, because of the additional expense of relying solely on ROM and the additional delay for downloading ROM contents into the RAM prior to the contents being accessible in the RAM, it is also desirable to devise a way to incorporate benefits of the programmability and differentiation of ROM with the benefits of a single RAM chip.

SUMMARY

Devices, systems, and methods are described for the implementation of a novel architecture of memory which functions as a RAM during normal operation; however, at the issuing of a start-up or reset signal, each individual cell of the RAM may enter a predefined logical state which is not dependent on the state of any other cell in the RAM, with the RAM not requiring to be loaded from an external source, such as a ROM.

Therefore, in one embodiment of the invention, ROM and RAM are combined into a circuit where the contents of the RAM are set in parallel by a single reset signal, typically sent at power on, which when deactivated allows normal writing to the RAM. Because the default contents are 'jammed' into the RAM by assertion of the power-on reset signal, the circuit may hereinafter be referred to as a jamRAM.

In some embodiments, each individual memory cell of an array of memory cells include a bit store, where the bit store can store a single logic value of true or false. Each individual memory cell may also include a reset device that is connected with the bit store. This reset device can set a particular logic value within the bit store when the reset device is triggered by a signal. Also present is a reset transmission device that is capable of triggering the reset device with a reset signal. This embodiment may also include a selector element, which is connected with the reset device, and determines the predefined logic value of the cell. This embodiment may also include a via layer that has a number of the selector devices located there. The selector devices may be vias, traces, or some combination thereof. In one embodiment, the selector element may be connected with varying parts of the bit store depending on whether the predefined logic value desired is true or false.

Further, one embodiment may contain a second reset device, where only either the first or the second reset device is connected to the reset transmission device. The predefined value to be set in the bit store following a reset signal is determined by which reset device is connected to the reset transmission device. This embodiment may have a second selector element connected with the second reset device. The second selector device may connect with the reset transmission device or may be connected with a static signal. This second selector device may be connected to electrical ground. The bit store may be a volatile form of storage and may at least partially consist of a latch loop.

In another embodiment of the invention a programmable volatile memory includes: a latch loop capable of retaining a logic state. A first reset device and a second reset device are each connected to the latch loop and either capable of being exclusively configured to set the latch loop to a corresponding first or second logic state. A reset line is capable of being configured to connect to either the first reset device or the second reset device, and a number of selector elements are connected to the first reset device and the second reset device, the selector elements configured to produce selective and exclusive connecting of either the first reset device or the second reset device to the reset line.

Some embodiments of the invention are realizable within a programmable volatile memory system, the memory system including an array of programmable volatile memory cells. Each of the memory cells may be configured to produce and retain a corresponding predetermined logic state, and each further capable of storing a further determined logic state. A selection circuit may be connected to the array of programmable volatile memory cells and configured to provide electrical communication of a select portion of the array of programmable volatile memory cells.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

Figure 1:
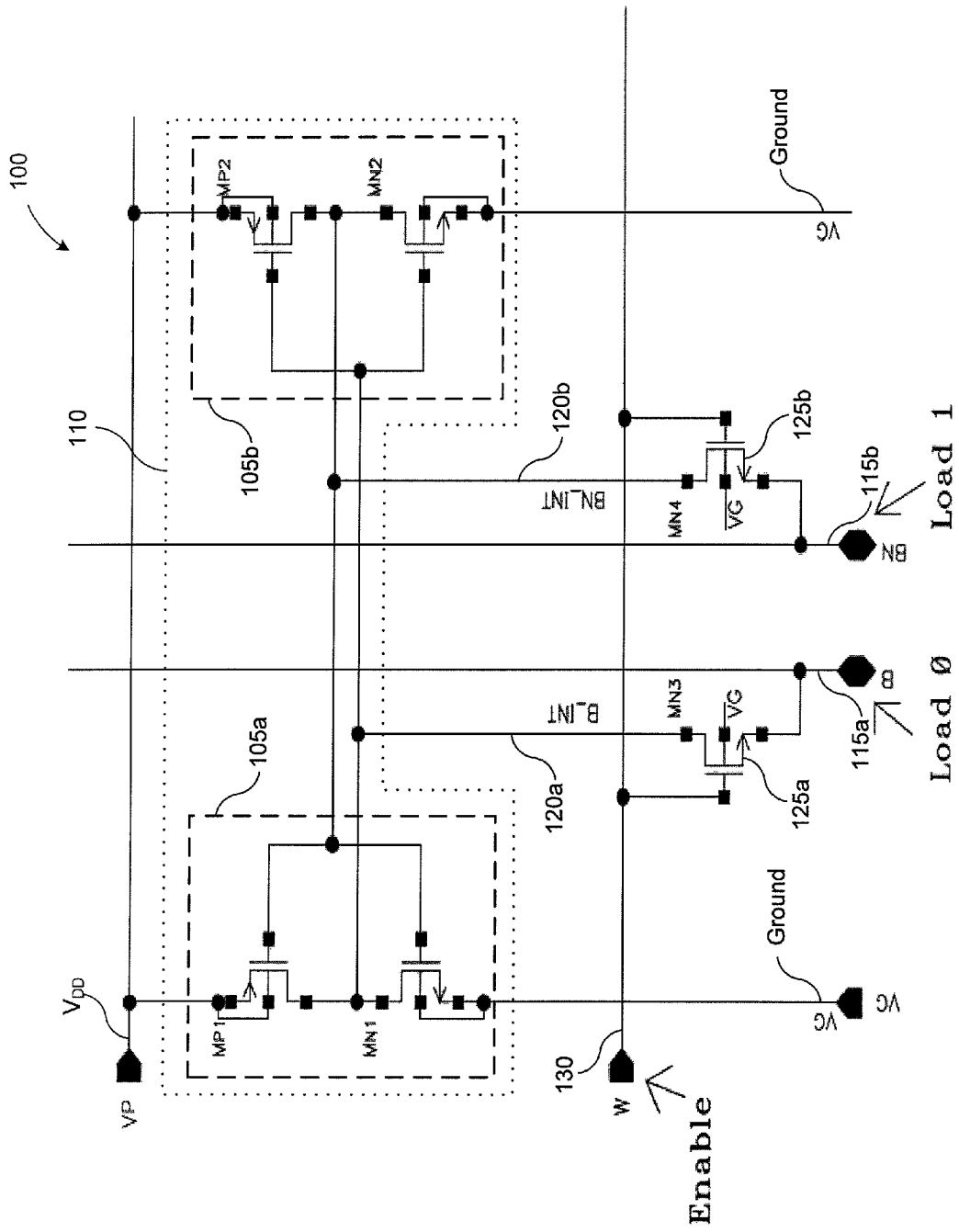
FIG. 1 is a schematic diagram of a configuration of an SRAM cell (Prior Art).
Figure 2:
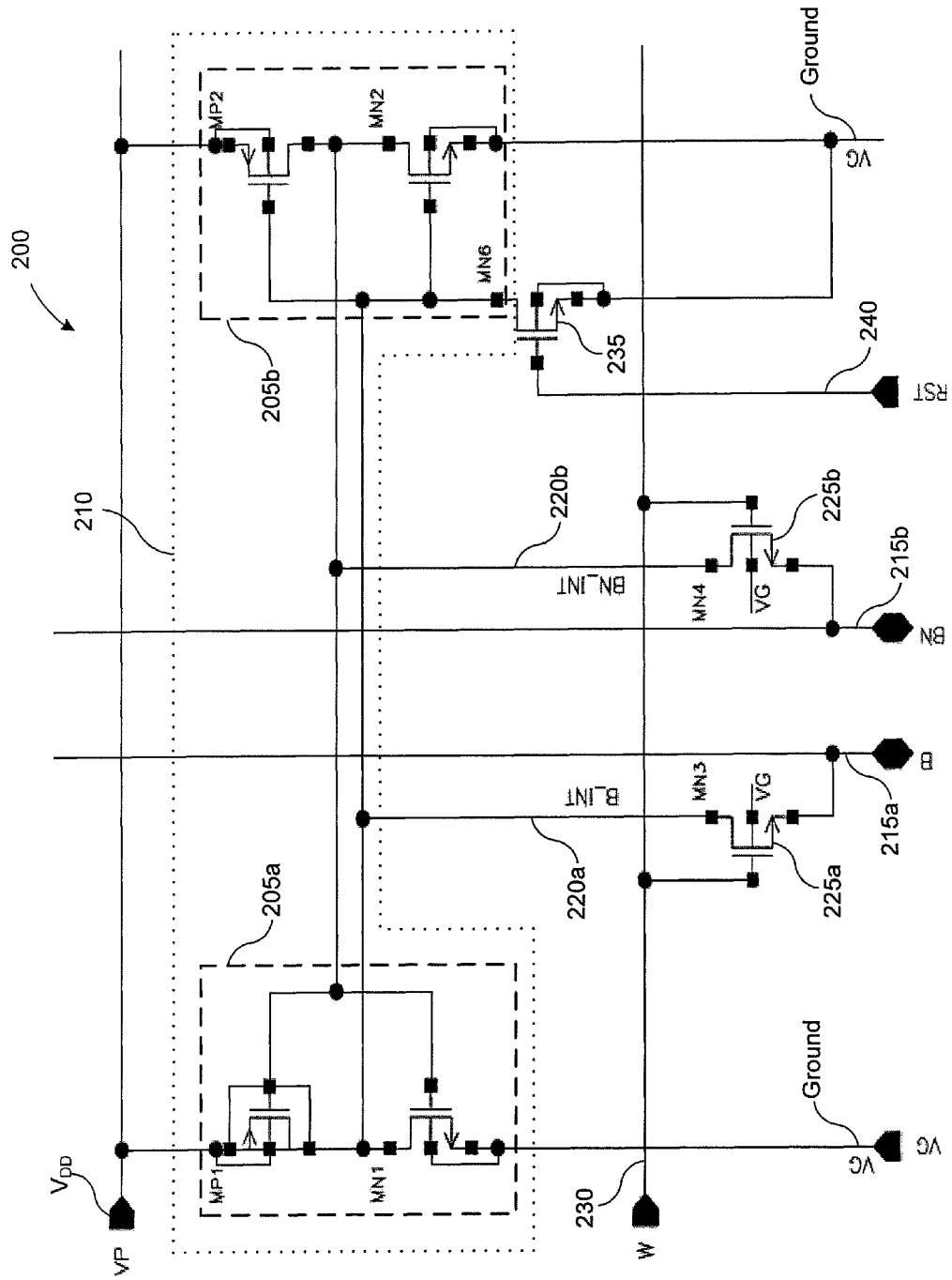
FIG. 2 is a schematic diagram of a resetting configuration of an SRAM cell (Prior Art).

Devices, systems, and methods are described for the implementation of a novel architecture of memory which may function as a RAM when a reset signal or a start-up signal is not asserted; however when such a signal is received, each individual cell of the RAM enters a predefined logical state which is not dependent on the state of any other cell of the RAM.

This description provides example embodiments only, and is not intended to limit the scope, applicability, or configuration of the invention. Rather, the ensuing description of the embodiments will provide those skilled in the art with an enabling description for implementing embodiments of the invention. Various changes may be made in the function and arrangement of elements without departing from the spirit and scope of the invention.

Thus, various embodiments may omit, substitute, or add, various procedures or components as appropriate. For instance, it should be appreciated that in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner.

It should also be appreciated that the following systems, methods, and software may individually or collectively be components of a larger system, wherein other procedures may take precedence over or otherwise modify their application. Also, a number of steps may be required before, after, or concurrently with the following embodiments.

A jamRAM may be used in a situation where an ordinary RAM and a ROM are typically used. Generally, whenever it is desired that a memory have at least some particular values upon reset or startup, a jamRAM may be used. An individual cell of jamRAM may function as any cell of RAM does during normal operation: a logic value of either 1 or 0 may be written to the cell from an external source, or the current logic value stored within the cell may be read by an external source. However, upon receipt of a reset or power-up signal, each cell of jamRAM is reset to a predefined logical value. When the cell receives the reset signal, the cell resets to the predefined value regardless of the value it currently stores or what is being stored in any other jamRAM cell. The predefined value of the jamRAM is defined by the components or arrangement of components within the individual jamRAM cell.

A jamRAM array is typically used to store a number of logical values. A jamRAM array is composed of a number of jamRAM cells. An example of a single jamRAM cell, with associated signals and values, is illustrated via block diagrams in FIG. 3. A jamRAM cell 300 may have the following components: 1) a bit store 305 that stores a single logical bit; 2) a data controller 310 that defines when the logical bit in the bit store may be accessed; and 3) a reset controller 340 that defines when the bit store will be reset to a predefined value 360. In the illustrated embodiments, the cell contains a bit store 305. The bit store 305 is a form of electronic memory which is capable of storing a logical bit. For example, the bit store may be implemented using a latch loop of transistors. A data controller 310 is in communication with the bit store 305. The data controller 310 may receive an enable signal 320 controlling whether the value of the bit store 305 may be accessed. The data controller 310 may be any electronic device capable of selectively allowing access to the bit store 305 depending on the enable signal. The enable signal 320 may come from another component of the jamRAM array, or from some component outside of the jamRAM array, such as an external device. The enable may be in the form of an electrical current or voltage. For example, a microprocessor may access the value of a particular cell of jamRAM by sending an enable signal 320, or the microprocessor may send a signal to another controller of the array of jamRAM cells, which in turn determines which cell should be accessed, and sends an enable signal 320 to the appropriate jamRAM cell or cells. When the enable signal is active, the bit store 305 asserts its stored value via data signal 330. Similarly to the enable signal 320, the data signal 330 may be routed to a controller of the jamRAM array or to an external device. A logical value may be written to the bit store 305 by asserting the enable signal 320, and asserting the desired logic value via data signal 330. In some embodiments, the data value is read and written using the same data signal, in other embodiments, a separate read signal and write signal is present.

A reset controller 340 may also be in communication with the bit store 305. The reset controller 340 is a component of the cell of jamRAM which receives the reset signal 350. The reset controller may be any electronic device capable of selectively allowing access to the bit store 305 depending on the reset signal, such as a transistor. When the reset signal 350 is received by the reset controller 340, the preset value 360 is loaded into bit store 305 regardless of the logical value currently stored within bit store 305. Reset signal 350 may have similar routing to data signal 330 and enable signal 320. The reset signal 350 may be controlled by another controller on-board to the jamRAM array, or it may be routed outside of the jamRAM array and controlled by an external device, such as a processor, a reset button, a power supply, or any other device that may issue a power-up or reset signal. The reset signal may also be controlled by multiple devices, individually capable or only capable together of issuing a reset command. The preset value 360 of each individual cell of jamRAM may be independent of each other cell of the jamRAM. Therefore, because each cell has an independent preset value 360, the jamRAM may be set to any desired combination of values.

The reset signal 350 may be asserted at any time. Typically, the reset signal 350 may be asserted upon power-up of the system such that the jamRAM will initially contain the preset values. The reset signal 350 may also be asserted after the device has been powered up for a time. This action will result in the present value of the bit store being lost and replaced with the preset value 360.

Figure 3:
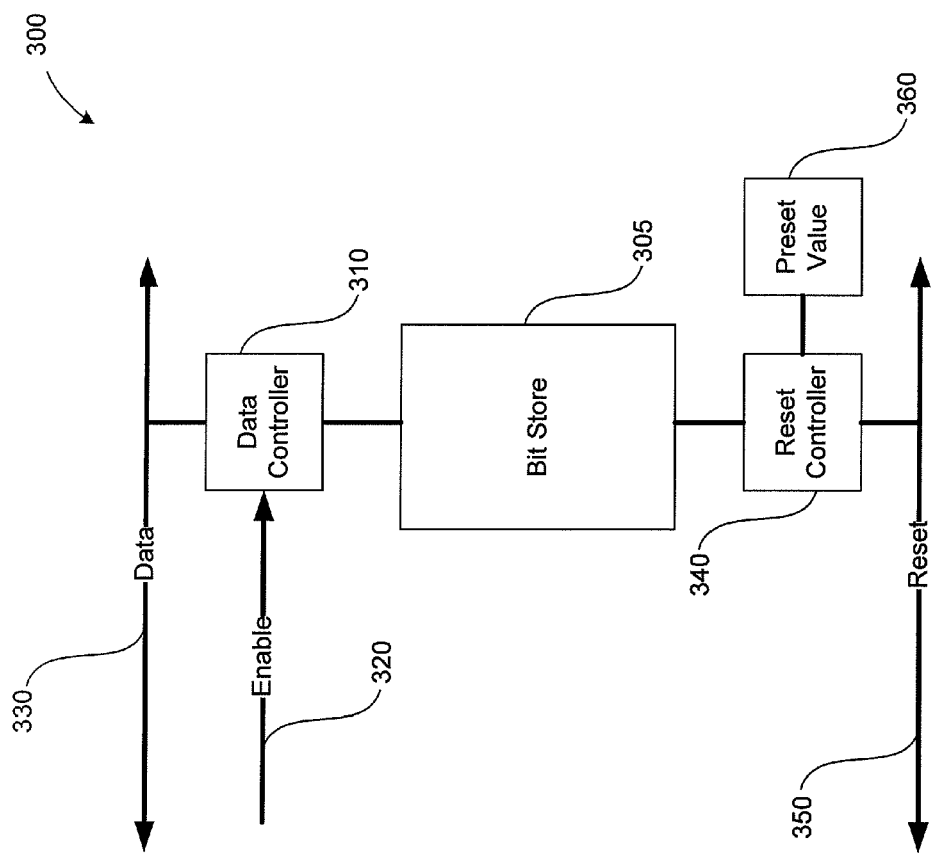
FIG. 3 is a block diagram of a settable jamRAM according to various embodiments of the invention.
Figure 4:
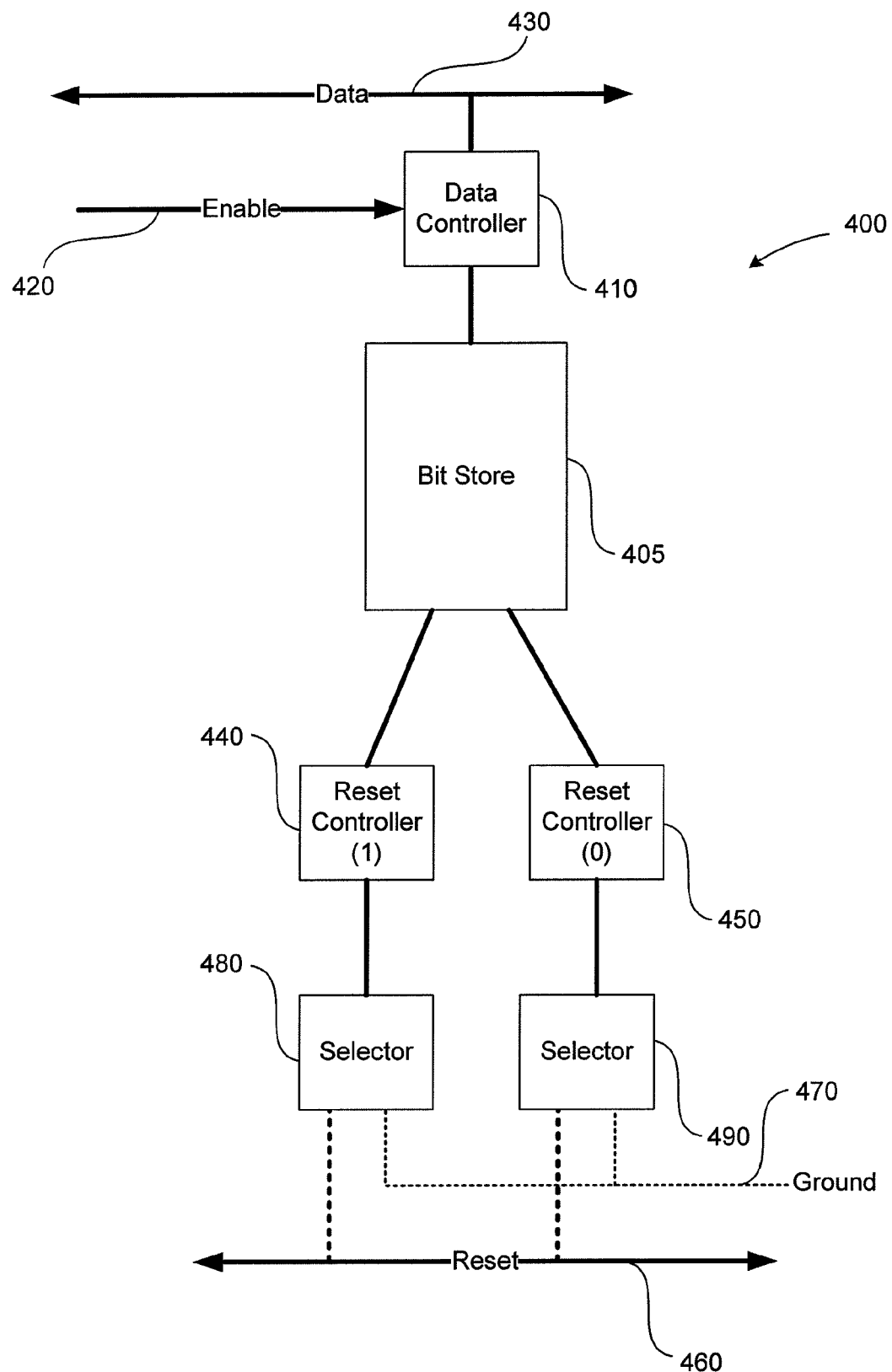
FIG. 4 is a block diagram of another embodiment of settable jamRAM with two reset controllers according to various embodiments of the invention.

While some embodiments of FIG. 3 use one reset controller, embodiments of jamRAM cells may use multiple reset controllers. Referring next to FIG. 4, another embodiment of a jamRAM cell 400 is illustrated via a block diagram. Some embodiments of jamRAM cell 400 include: 1) a bit store 405 that stores a single logical bit; 2) a data controller 410 that defines when the logical bit in the bit store may be read or written; 3) two reset controllers 440 and 450 that define when the bit store will be reset to a predefined value; and 4) two selectors 480 and 490, which determine which reset controller is connected to the reset signal 460. JamRAM cell 400 may be the jamRAM cell 300 of FIG. 3. As noted in reference to FIG. 3, a bit store 405 may store a logical value of either true or false. As in FIG. 3, access to the bit store 405 is controlled by a data controller 410 and an enable signal 420. The data controller 410 and enable signal 420 function as in FIG. 3. Some embodiments of a jamRAM cell contain a first reset controller 440, and a second reset controller 450 (reset controllers are alternatively referred to as reset devices throughout this specification). These reset devices may be implemented using the same components used to implement the reset device in FIG. 3. In some configurations, first reset controller 440 asserts a true on bit store 405 when triggered by the reset signal 460. Second reset controller 450 asserts a false on bit store 405 when triggered by reset signal 460. In one embodiment, only one of reset controller 440 and reset controller 450 is connected to reset signal 460. The decision on which reset controller is connected to reset signal 460 is determined based on the desired preset value, which may be made at the time of manufacture of the jamRAM cell 400. Therefore, if first reset controller 440 is connected with reset line 460, the second reset controller 450 is not. In this embodiment, reset controller 450 is connected to electrical ground 470. This maintains reset controller 450 in a permanent state where it does not affect the value of the bit store 405, regardless of the reset signal 460. Alternatively, if the second reset controller 450 is connected to reset signal 460, reset controller 440 is connected to electrical ground 470.

First reset controller 440 and second reset controller 450 may also be connected to different sections of the bit store 405. For example, if the base design of RAM employed is SRAM, the first reset controller 440 and the second reset controller 450 are connected to different parts of the latch loop. Therefore, if both first reset controller 440 and second reset controller 450 are capable of asserting a logical value of "0," when one of the reset controllers 440 or 450 asserts a "0" on one part of the latch loop, the effect will be a "0" on the output of the jamRAM. When the other reset controller 440 or 450 asserts a "0" on another part of the jamRAM latch loop, the effect will be a "1" on the output of the jamRAM cell.

First reset controller 440 and second reset controller 450 may receive reset signal 460, and are connected and electrical ground 470 via selectors 480 and 490. Reset signal 460 is similar to the reset signal discussed in reference to FIG. 3. The first selector 480 connects reset controller 440 to either ground 470 or reset signal 460. The second selector 490 connects reset controller 450 to either ground 470 or reset signal 460. Selector 490 is connected to ground 470 if the first selector 480 is connected to reset signal 460. The reverse situation is also true.

The use of selectors to determine which reset controllers are connected to the reset signal and which to ground may be especially useful when the embodiment is viewed from an array level. The use of selectors to determine the preset value allows the entire jamRAM array to be manufactured in the same fashion, varying only one mask layer during fabrication of the final jamRAM circuit depending on the desired preset configuration. The entire preset value of the memory may be varied by changing which selectors are connected to the reset signal on the one via layer.

While this described embodiment states that the selector elements may connect to ground or the reset signal, other embodiments are possible where the selector elements connect between, for example, power and the reset line. This change may be implemented by using PMOS MOSFET technology instead of NMOS MOSFET technology.

Figure 5:
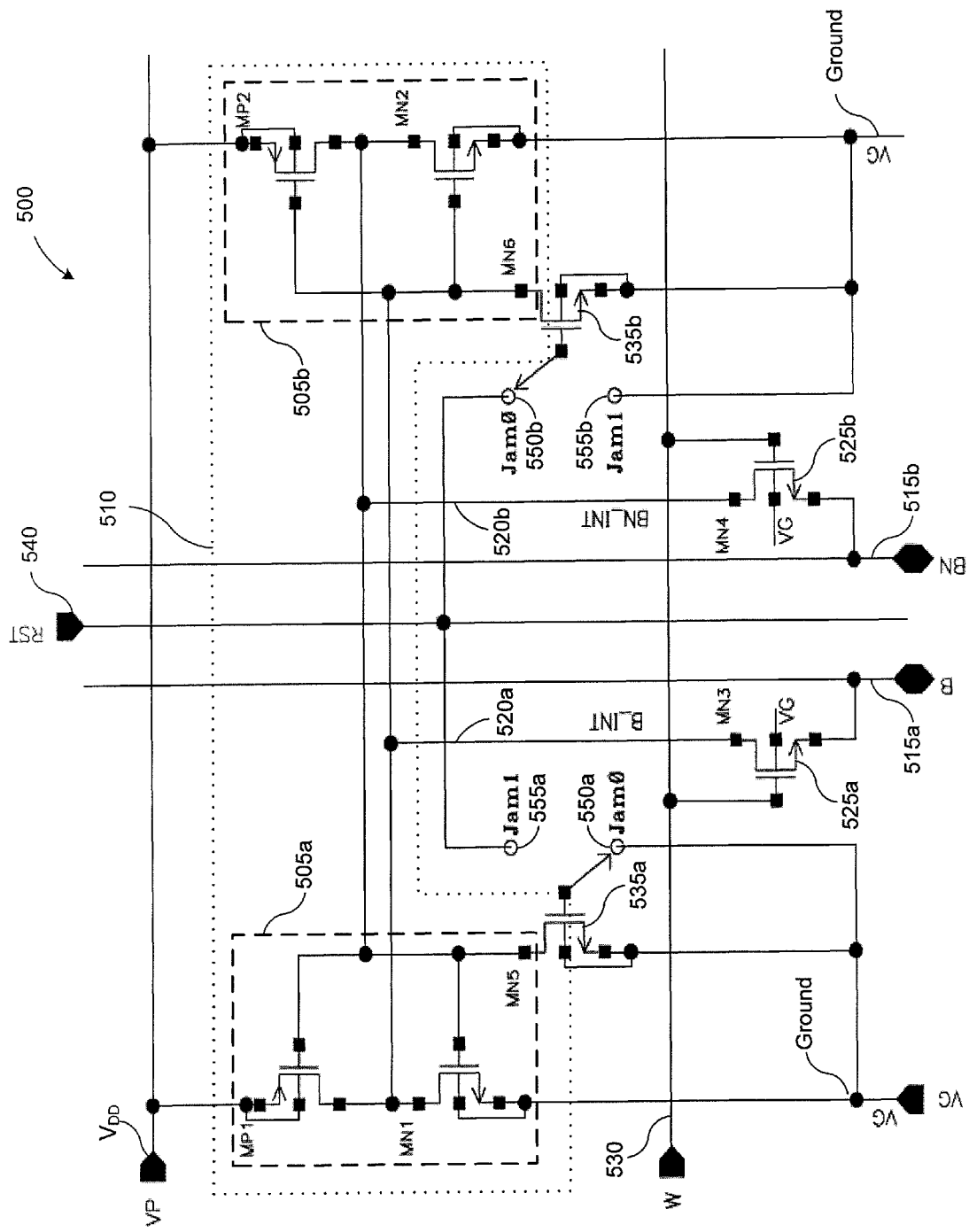
FIG. 5 is a schematic diagram of a resetting configuration of a jamRAM cell using two reset devices according to various embodiments of the invention.

The jamRAM cells depicted with block diagram in FIG. 4, may be implemented in some embodiments using transistors, traces, and vias. For example, some embodiments using such devices are illustrated by an example jamRAM cell 500 in FIG. 5. Referring now to FIG. 5, some embodiments of jamRAM are implemented using transistors in a basic SRAM configuration. A first inverter, consisting of MP1 and MN1, collectively 505*a*, and a second inverter, consisting of MP2 and MN2, collectively 505*b*, are cross-connected to form a Latch Loop 510 in a jamRAM cell 500, according to an example embodiment. The first inverter 505*a* and the second inverter 505*b* each are connected to $V_{DD}$ (VP) and Ground (VG). A Bitline (B) 515*a* and a Bitline_Bar (BN) 515*b* connect to a first Latch Loop output (B_INT) 520*a* and a second Latch Loop output (BN_INT) 520*b* through a first Bitline Accessing device (MN3) 525*a* and a second Bitline Accessing device (MN4) 525*b*, respectively. A Wordline (W) 530 connects to control inputs of the first Bitline Accessing device 525*a* and the second Bitline Accessing device 525*b*, respectively. A first reset device 535*a* and a second reset device 535*b* connect between ground and inputs to the first inverter 505*a* and the second inverter 505*b*, respectively. A reset line (RST) 540 is capable of connecting to control inputs of the first reset device 535*a* and the second reset device 535*b*.

Complementary programming via pairs Jam0 and Jam1 are present at the control inputs of the first Reset device (MN5) 535*a* and a second reset device (MN6) 535*b*. A first via 550*a*, of the first programming via pair Jam0, is capable of connecting between a control input of the first reset device 535*a* and ground. A second via 550*b*, of the first Programming Via Pair Jam0, is capable of connecting between a control input of the second reset device 535*b* and the Reset line 540. A third via 555*a*, of the second Programming Via Pair Jam1, is capable of connecting between a control input of the first reset device 535*a* and the reset line 540. A fourth via 555*b*, of the second programming via pair Jam1, is capable of connecting between a control input of the second reset device 535*b* and ground.

Continuing to refer to FIG. 5, one of the two possible programming via pairs Jam 0, Jam 1 may be selectively implemented within the jamRAM cell 500. For example, the first programming via pair Jam 0 may be implemented while the second programming via pair Jam 1 is not implemented. Implementation of the first programming via pair Jam 0 is indicated by a first arrow between a control input of the first reset device 535*a* and the first via 550*a* (connecting to ground) and a second arrow between a control input of the second reset device 535*b* and the second via 550*b* (connecting to the reset line 540). Implementation of a programming via pair may be, for example, a metallization plug fabricated between two metal layers in a multiple metal layer CMOS technology at the two corresponding via sites. Additionally, one skilled in the art may readily conceive of alternative equivalent embodiments within other semiconductor technologies. For example, one skilled in the art would recognize that a highly conductive plug may be selectively fabricated between two highly conductive routing layers within a semiconductor technology, such as, for example a bipolar or a BICMOS fabrication process.

Figure 6:
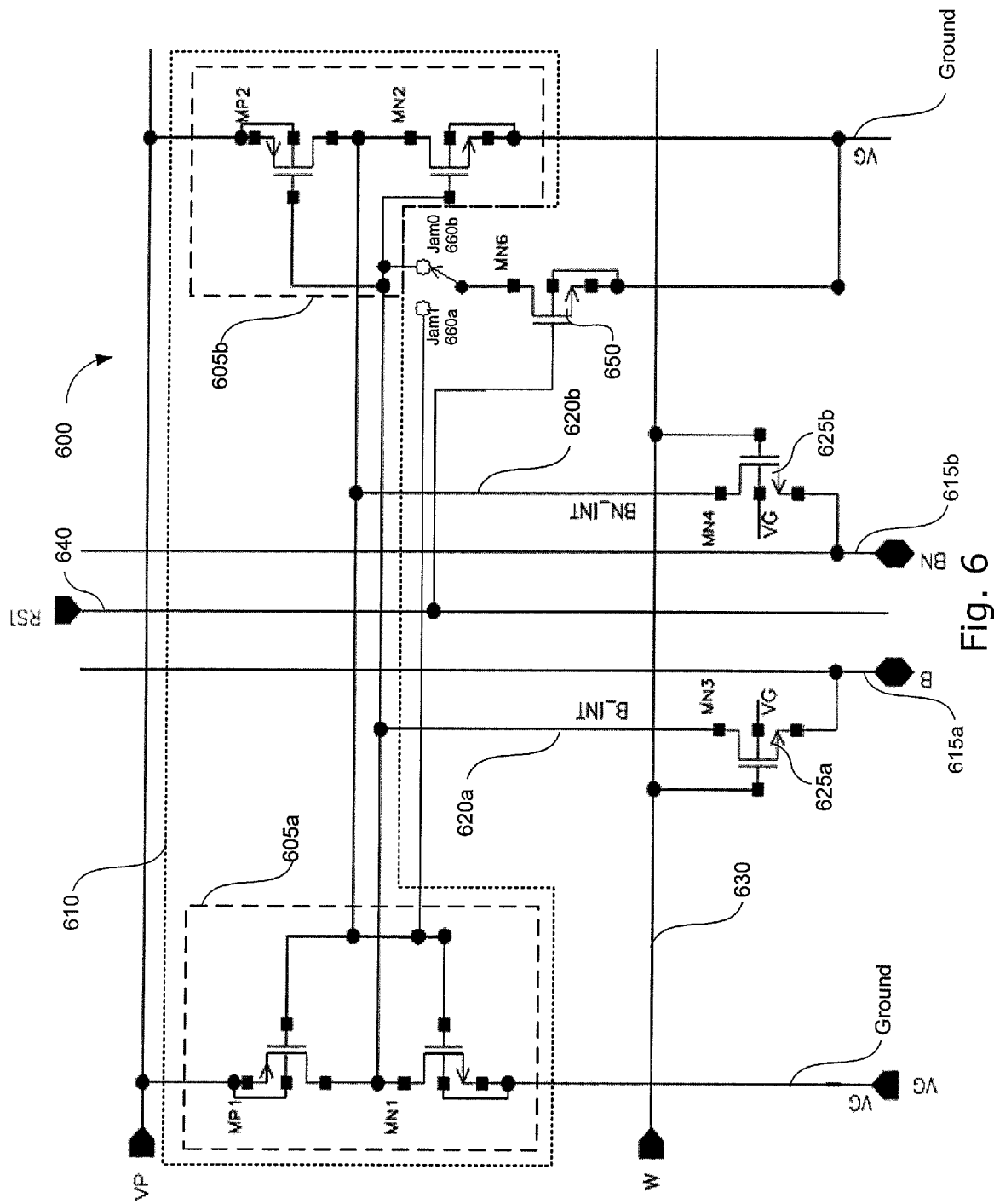
FIG. 6 is a schematic diagram of a resetting configuration of a jamRAM cell using one reset devices according to various embodiments of the invention.

While FIG. 5 depicts two connector devices and two reset devices, a cell of jamRAM may be implemented using one reset device, as in FIG. 3. Such a device is depicted using transistors in FIG. 6. Referring now to FIG. 6, some embodiments of a one reset device cell of jamRAM 600 implemented using transistors in a basic SRAM configuration is illustrated. A first inverter 605*a*, consisting of MP1 and MN1, and a second inverter 605*b*, consisting of MP2 and MN2, are cross-connected to form a Latch Loop 610 in a jamRAM cell 600, according to an exemplary embodiment of the present invention. The first inverter 605*a* and the second inverter 605*b* each connect to $V_{DD}$ (VP) and Ground (VG). A Bitline (B) 615*a* and a Bitline_Bar (BN) 615*b* connect to a first Latch Loop output (B_INT) 620*a* and a second Latch Loop output (BN_INT) 620*b* through a first Bitline Accessing device (MN3) 625*a* and a second Bitline Accessing device (MN4) 625*b* respectively. A Wordline (W) 630 connects to control inputs of the first Bitline Accessing device 625*a* and the second Bitline Accessing device 625*b* respectively. One reset device (MN6) 650 is present. Reset device 650 is connected to the reset line 640. Reset device 650 is alternatively connected to either the first inverter 605*a* or the second inverter 605*b*. Programming via 660*a* and programming via 660*b* select between Jam1 and Jam0. If via 660*a* is implemented, reset device 650 will be connected with the first inverter 605*a*, thus asserting a false (0) on Bitline_Bar (BN) 615*b*. If instead, via 660*b* is implemented, reset device 650 will be connected with the second inverter 605*b*, thus asserting a false (0) on Bitline (B) 615*a*, effectively asserting a "1" on bit line Bitline_Bar (BN) 615*b*.

Figure 7:
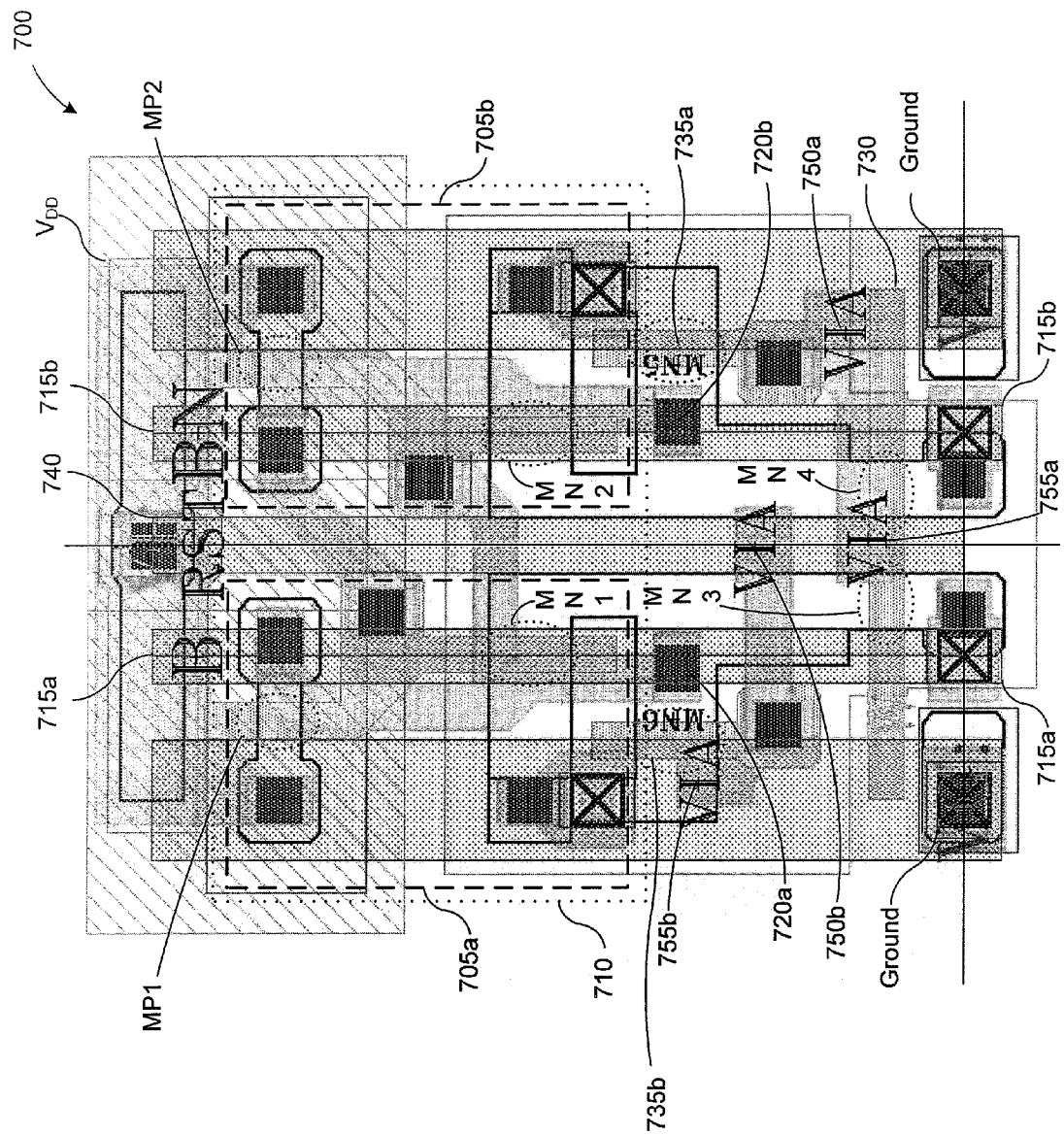
FIG. 7 is a topological layout diagram of a jamRAM cell corresponding to FIG. 5 according to various embodiments of the invention.

A cell of jamRAM using two transistor based reset devices and two connector devices may result in an efficient manufactured layout. FIG. 7 depicts a circuit which may embody FIG. 3, 4 or 5. Referring now to FIG. 7, a two reset device microchip layout of a jamRAM using a basic SRAM configuration is illustrated. A first inverter (MP1,MN1) 705*a* and a second inverter (MP2,MN2) 705*b* are cross-connected to form a Latch Loop 710 in an example topological embodiment of a jamRAM cell 700. The first inverter 705*a* and the second inverter 705*b* each connect to $V_{DD}$ (VP) and Ground (VG). A Bitline (B) 715*a* and a Bitline_Bar (BN) 715*b* connects to a first Latch Loop output (B_INT) 720*a* and a second Latch Loop output (BN_INT) 720*b* through a first Bitline Accessing device MN3 (which may, for example, correspond to reference numeral 525*a* of FIG. 5) and a second Bitline Accessing device MN4 (e.g., 525*b* of FIG. 5) respectively. A Wordline (W) 730 connects to control inputs of the first Bitline Accessing device MN3 and the second Bitline Accessing device MN4 respectively. A first Reset device MN5 and a second Reset device MN6 connect between Ground and the inputs to the first inverter 705*a* and the second inverter 705*b* respectively. A reset line (RST) 740 is capable of being configured to connect to control inputs of the first Reset device MN5 and the second Reset device MN6.

Complementary Programming Via Pairs Jam0, Jam1, as described in FIG. 5, are present at the control inputs of the first Reset device (MN5) 735*a* and a second Reset device (MN6) 735*b*. A first via 750*a* (of the first Programming Via Pair Jam0) is capable of connecting between a control input of the first Reset device MN5 and Ground. A second via 750*b* (of the first Programming Via Pair Jam0) is capable of connecting between a control input of the second Reset device MN6 and the Reset line 740. A third via 755*a* (of the second Programming Via Pair Jam1) is capable of connecting between a control input of the first reset device MN5 and the reset line 740. A fourth via 755b (of the second Programming Via Pair Jam1) is capable of connecting between a control input of the second Reset device MN6 and Ground.

In continuing to refer to FIGS. 5 and 7, resetting of the jamRAM cell occurs by producing a high logic level on the Reset line 540, 740 while low logic level is applied to the wordline 530, 740. Implementing the first Programming Via Pair Jam0 means that the first via 550a, 750a connects the control input of the first Reset device 535a, MN5 to Ground, deactivating the device. The second via 550b, 750b (implemented in the first Programming Via Pair Jam0) connects the control input of the second Reset device 535b, 735b to the Reset line 540, 740. The high logic level on the Reset line 540, 740 is therefore provided to the control input of the second Reset device 535b, MN6. Activating the second Reset device 535b, MN6 produces a low logic level into the second inverter 505b, 705b and resets the Latch Loop 510, 710 (producing a low logic level on the first Latch Loop output 520a, 720a). The drive strength of each reset device is sufficient so that, when configured by a corresponding programming via and provided with the assertive logic level, that a logic level, for example, a low logic level is produced in the Latch Loop 510, 710. The control input of the first Reset device 535a, 735a is connected to Ground by implementation of the first via 550a, 750a, leaving the first Reset device 535a, 735a inactive, and thereby produces an open or high impedance between the input to the first inverter 505a, 705a and Ground. The programming via pair that is implemented determines the logic state that the jamRAM cell is configured to be set to. Either the first Programming Via Pair Jam0 or the second Programming Via Pair Jam1 may be implemented to determine that the jamRAM cell logic be reset or set to either a low logic level (e.g., programmed to "a zero" state or level) or a high logic level. For proper setting of the jamRAM state, the implementation of the first Programming Via Pair Jam0 or the second Programming Via Pair Jam1 are mutually exclusive, i.e., only one is implemented at a time.

The setting of programming via pairs provides a way of determining the state of each jamRAM cell independently and simultaneously. In semiconductor fabrication of a CMOS process, for example, the first Programming Via Pair Jam 0 and the second Programming Via Pair Jam 1 may be implemented with use of a single mask layer. Implementing the two vias that are to be programmed in order to implement a predetermined programming via pair, may be done with use of a programming language or "macro" language such as, for example, the SKILL® language (from Cadence Design Systems, Inc.). A macro or program may be implemented that interacts with configuration information, such as the code or specification that would be used to configure ROM, can be utilized to select which set of programming vial via pairs will implement a desired state for each jamRAM cell. The corresponding topological feature corresponding to the desired vias in, for example, the appropriate mask layer, will be provided within the topological region corresponding to the determined jamRAM cell. In this way, the ROM-like features of the jamRAM cell are provided in a semiconductor fabrication scheme with programmable implementation according to each production instance desired.

Additionally, the RAM-like features of the jamRAM cell are significant to particular implementations by extending the ROM capabilities and supplying general read/write memory. The RAM capabilities, for instance, allow particular jamRAM cells to be overwritten with new or updating logic states for predetermined jamRAM cells. This feature allows for changes in ROM code since a product's original fabrication to be provided as needed to accommodate changing requirements in the operational environment of a product incorporating jamRAM. Such updating capabilities may be further implemented "in the field" (in an end user's environment) by a communication link that may provide the updating information to a memory subsystem incorporation jamRAM-based memory. In such a memory subsystem the ROM-like update may be provided to a product sitting in place within a working environment and still use the original jamRAM memory space. In yet a further use of the jamRAM cell, in a developmental environment, code that is to be provided in a fixed nature to a product in final production, but is in flux due to the development of the product, may be implemented in jamRAM cells, modified as needed in RAM fashion during development, and fixed in the final product by the implementation of the programming via pairs that correspond to the final code determined in development of the product.

One skilled in the art will readily appreciate the alternative control and activation signaling exists generally in the control and communications between logic circuits. For example, assertive logic levels maybe a low logic level ("active low" signaling) and in conjunction with equivalent and complementary logic schemes, achieve an equivalent result as exemplified above.

Figure 8:
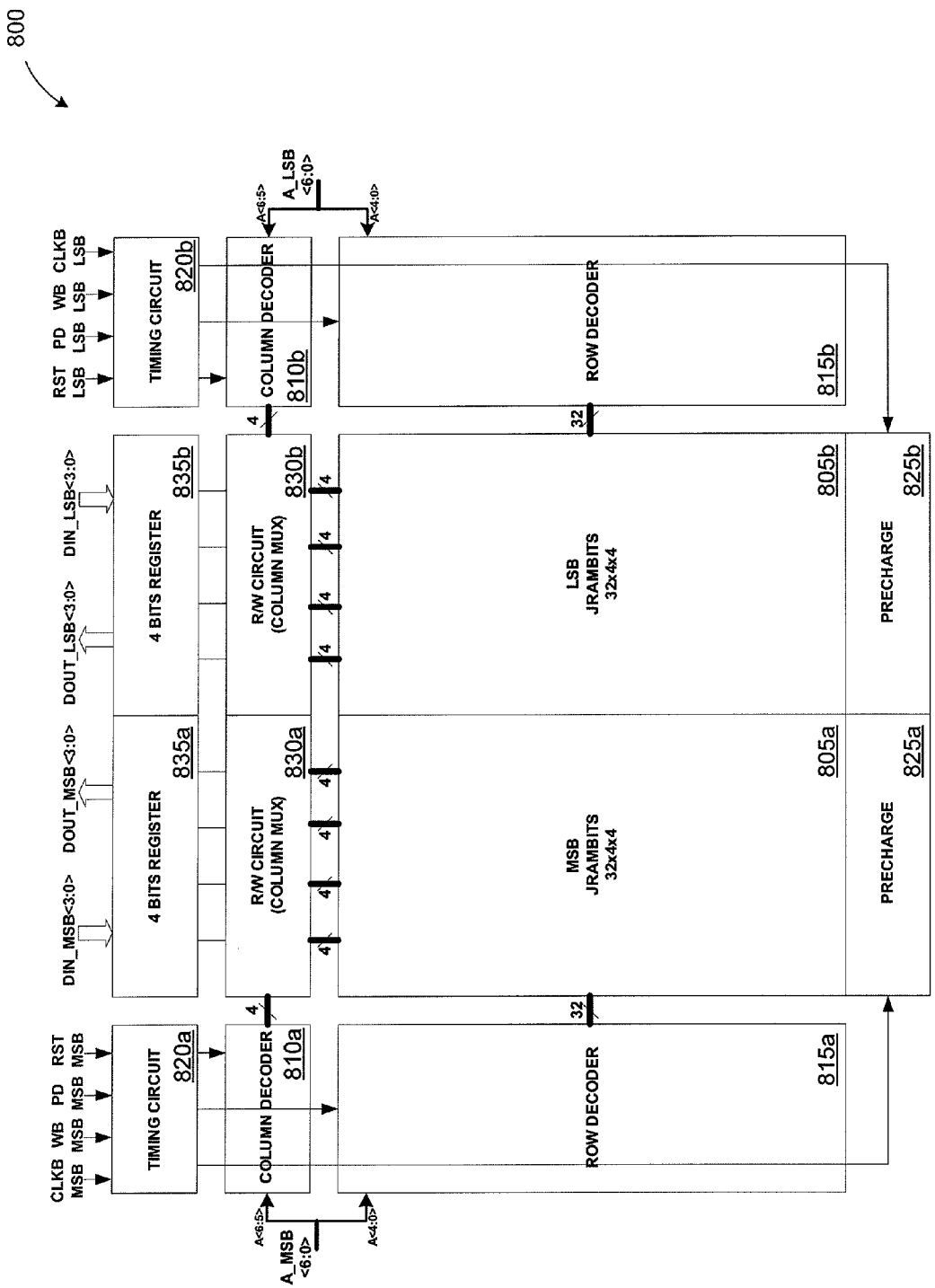
FIG. 8 is a block diagram of a memory system incorporating embodiments of the present invention according to various embodiments of the invention.

An array of jamRAM cells may be implemented in order to store a multitude of logical bits. Some embodiments of such an array are depicted in FIG. 8. Now referring to FIG. 8, a jamRAM-based memory subsystem 800 includes jamRAM cell arrays 805a,b, column decoders 810a,b, row decoders 815a,b, a timing circuits 820a,b, precharge circuits 825a,b, column multiplexers (column mux) 830a,b, and output registers 835a,b. For each bit being output, a 128×1 bit array, within either of the jamRAM cell arrays 805a,b, is implemented using 32 rows and 4 columns of jamRAM cells in order to reduce the column parasitic capacitance which would otherwise be excessive due to the combined length of fewer bitlines. The row decoders 815a,b enable corresponding rows depending on address bits input on a low-order portion (A<4:0>) of the address bus. The column decoders 810a,b enable one of four columns corresponding to the most significant bits (A<6:5>) of the address bus. The timing circuits 820a,b generate non-overlapping internal clocks for write, read, and pre-charge operations. The pre-charge circuits 825a,b charge differential bit lines B,BN (FIG. 3) to VDD prior to any read/write operation to prevent accidental bit overwrite. The register circuits 835a,b combined, latch 8-bit output data. Within a memory system, signaling which produces the high (assertive) logic level on the Reset line 340, is coordinated with a corresponding gating (blocking) of the write clock to the remainder of any jamRAM cells in related memory cell arrays. Write clock gating ensures that no writing operations are undertaken while a jamRAM cell is being reset which could produce an undesirable result. Therefore, a Reset signal (not shown) may be issued asynchronously from the Write clock. A jamRAM cell 300 may thus be configured, through selective use of programming via pairs, to reset the latch loop 310 to a predetermined logic state with activation of the Reset line 340 without any upset of other jamRAM cell arrays 805a,b in the jamRAM-based memory subsystem 800.

Figure 9:
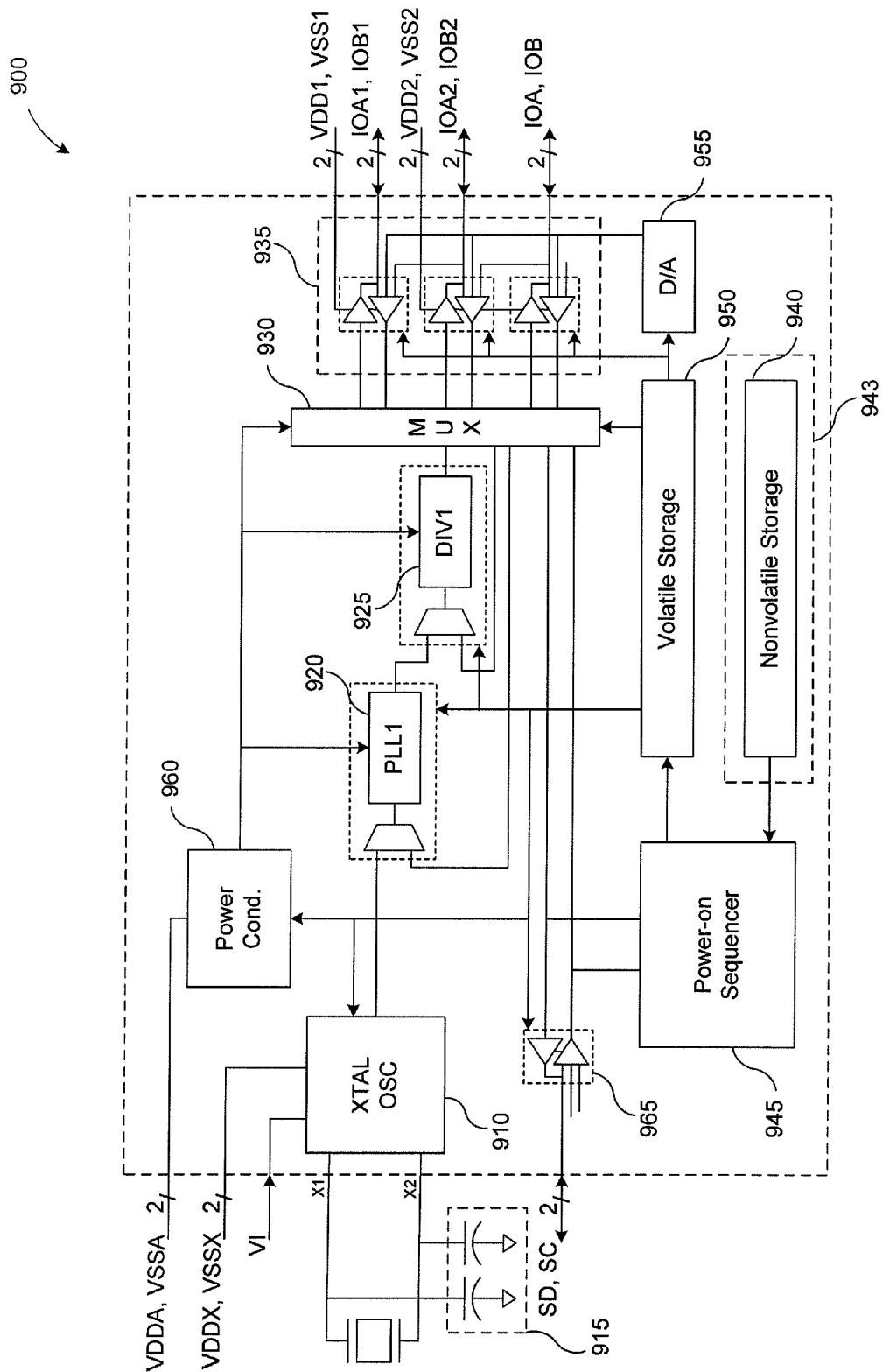
FIG. 9 is a block diagram of an electronic system incorporating embodiments of the present invention according to various embodiments of the invention.

FIG. 9 illustrates a simplified block diagram of a circuit arrangement 900 that may utilize jamRAM, according to various embodiments of the invention. An external crystal connects to a voltage controlled crystal oscillator (VCXO) 910 in an exemplary embodiment. A pair of capacitors 915 connect crystal oscillator inputs X1, X2 to ground. VCXO power (VDDX), VCXO ground (VSSX), and VCXO input voltage (VI) are external inputs to the VCXO 510.

An output of the VCXO 910 is connected with an input multiplexer (mux) of a phase lock loop (PLL1) 920, providing a reference signal for the PLL 920. In other embodiments, additional PLLs 920 may be used to allow for additional I/Os and further programmability. An output of the phase lock loop 920 is connected with an input multiplexer (mux) of a PLL divider (DIV1) 925. An output of the PLL divider 925 is fed to a MUX 930. A first set of outputs of the MUX 930 are connected with programmable input/output buffers 935. Additional outputs from the MUX 930 may be connected with the input mux of PLL1 920 and the input mux of the PLL divider 925.

It will be appreciated that embodiments of each instance of the programmable input/output buffers 935 (shown as a dashed box) implement two programmable I/O buffers. As shown, a first set of bi-directional (input/output) connections IOA1, IOB1 is powered by a first set of output buffer power supply terminals VDD1, VSS1; a second set of bi-directional (input/output) connections IOA2, IOB2 is powered by a second set of output buffer power supply terminals VDD2, VSS2; and a third set of bi-directional (input/output) connections IOA, IOB is powered by the second set of output buffer power supply terminals VDD2, VSS2. Terminals IOA, IOB, IOA1, IOB1, IOA2, and IOB2 provide interfaces to six programmable I/O buffers. In other embodiments, there may be more, or fewer programmable I/O buffers.

The clock generator circuit 900, including a nonvolatile storage array 940, may be fabricated, for example, in a single monolithic semiconductor substrate or alternately, the nonvolatile storage array 940 may reside on a second semiconductor substrate 943. The non-volatile storage 940 may be a ROM. An output of the nonvolatile storage array 940 may be in communication with a power-on sequencer 945. The power-on sequencer 945 may communicate with a volatile storage array 950. This volatile storage array 950 may be implemented as an array of jamRAM cells, as illustrated in FIGS. 2-8. Therefore, predefined values may be present in the jamRAM upon startup or reset. If the volatile storage 950 is a jamRAM, the nonvolatile storage 940 may not be present. In some embodiments, the nonvolatile storage 943 is present when the volatile storage 950 is jamRAM. This configuration allow preset values to be available immediately upon reset, and for certain values of the jamRAM to be written to or overwritten by the nonvolatile storage 940.

The Nonvolatile Storage array 940 and the Volatile Storage array 950 may be implemented from a single array of jamRAM cells 300 and thus save considerable area on a semiconductor substrate. This area savings is possible by the consolidation of the ROM and RAM characteristics of the Nonvolatile Storage array 940 and the Volatile Storage array 950, respectively, being partially combined in a single array of jamRAM cells 300. JamRAM content can be accessed for read or write operations via IIC interface. JamRAM read/write access times are suitable for fasted IIC protocol speed (e.g., 400 kHz).

The volatile storage array 950 is in communication with a digital-to-analog (D/A) block 955, a power conditioner block 960, a serial I/O block 565, the programmable input/output buffers 935, the mux 930, the PLL 920, the PLL divider 925, and the VCXO 910. The serial I/O block 965 communicates with serial data and serial clock inputs SD,SC, the power-on sequencer 945, and the MUX 930. The power conditioner block 960 is connected with PLL power inputs VDDA, VSSA.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Moreover, as disclosed herein, the term "memory" or "memory unit" may represent one or more devices for storing data, including read-only memory (ROM), random access memory (RAM), magnetic RAM, core memory, magnetic disk storage mediums, optical storage mediums, flash memory devices, or other computer-readable mediums for storing information. The term "computer-readable medium" includes, but is not limited to, portable or fixed storage devices, optical storage devices, wireless channels, a sim card, other smart cards, and various other mediums capable of storing, containing, or carrying instructions or data.

Furthermore, embodiments may be implemented by hardware, software, firmware, middleware, microcode, hardware description languages, or any combination thereof. When implemented in software, firmware, middleware, or microcode, the program code or code segments to perform the necessary tasks may be stored in a computer-readable medium such as a storage medium. Processors may perform the necessary tasks.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. An array of memory cells comprising:
   a first memory cell comprising:
   a bit store, configured to store a logic value;
   a first reset device, communicatively coupled with the bit store, configured to set the bit store to a predefined logic value when triggered, wherein the predefined logic value is independently configurable with respect to at least one other memory cell of the array; and a selector element configurable to determine the predefined logic value.

2. The array of memory cells of claim 1, further comprising:
a via element, wherein the selector element is configurable in a first state and a second state, wherein in the first state the selector element is coupled to the via element, and wherein in the second state the selector element is not coupled to the via element.

3. The array of memory cells of claim 2, further comprising a reset transmission device configured to transmit a reset signal to the via element, wherein when the selector element is configured in the first state, the selector element sets the bit store to the predefined logic value in response to the reset signal.

4. The array of memory cells of claim 1, wherein the selector element is a via, a trace, or a combination thereof.

5. The array of memory cells of claim 1, wherein the selector element is configured to be coupled with either a first portion of the bit store setting the predefined logic value to a first logic value or to a second portion of the bit store setting the predefined logic value to a second logic value.

6. The array of memory cells of claim 1, wherein the first memory cell is a volatile form of storage.

7. The array of memory cells of claim 1, wherein the first memory cell comprises a latch loop.

8. The array of memory cells of claim 1, integrated within a field-programmable read-only memory (ROM) device.

9. The array of memory cells of claim 1, wherein the selector element is configurable to set the predefined logic value to a first logic value, and wherein the first memory cell further comprises a second selector element configurable to set the predefined logic value to a second logic value.

10. The array of memory cells of claim 1, further comprising:
a second memory cell including:
a second bit store, configured to store a logic value; and
a second reset device, communicatively coupled to the second bit store and configured to set the second bit store to a predefined logic value when triggered, wherein the predefined logic value of the second memory cell is independently configurable with respect to the predefined logic value of the first memory cell.

11. An array of memory cells, each of at least a subset of the array of memory cells comprising:
a bit store, configured to store a logic value;
a first reset device, communicatively coupled with the bit store, and configured to set the bit store to a predefined logic value when triggered, wherein the predefined logic value for the each of at least the subset of the array of memory cells is independently configurable with respect to at least one other memory cell of the array;
a reset transmission device, communicatively coupled with the first reset device, configured to trigger the first reset device with a reset signal; and
a second reset device, the second reset device communicatively coupled with the reset transmission device in the alternative to the first device, the predefined logic value dictating whether the first reset device or the second reset device is communicatively coupled with the reset transmission device.

12. The array of memory cells of claim 11, for the each of at least the subset of the memory cells further comprising a second selector element configured to communicatively couple with the second reset device, the second selector element communicatively coupling the second reset device to a static signal or the second selector element communicatively coupling the second reset device to the reset transmission device.

13. The array of memory cells of claim 12, the second reset device further configured to be communicatively coupled with electrical ground, such that the second reset device has a permanent state.

* * * * *

UNITED STATES PATENT AND TRADEMARK OFFICE
CERTIFICATE OF CORRECTION

| | | |
|---|---|---|
| PATENT NO. | : 8,111,535 B2 | Page 1 of 1 |
| APPLICATION NO. | : 12/369875 | |
| DATED | : February 7, 2012 | |
| INVENTOR(S) | : Ahmet Akyildiz et al. | |

It is certified that error appears in the above-identified patent and that said Letters Patent is hereby corrected as shown below:

Col. 9, line 53, please delete "vial"

Signed and Sealed this
Seventeenth Day of April, 2012

David J. Kappos
*Director of the United States Patent and Trademark Office*